United States Patent [19]
Yang

[11] Patent Number: 6,011,276
[45] Date of Patent: Jan. 4, 2000

[54] THIN FILM TRANSISTOR AND FABRICATION METHOD THEREOF

[75] Inventor: Hae-Chang Yang, Cheongju, Rep. of Korea

[73] Assignee: LG Semicon Co., Ltd., Choongcheongbuk-Do, Rep. of Korea

[21] Appl. No.: 08/953,651

[22] Filed: Oct. 17, 1997

[30] Foreign Application Priority Data

May 7, 1997 [KR] Rep. of Korea ...................... 97-17387

[51] Int. Cl.⁷ .................... H01L 21/28; H01L 21/336; H01L 29/41; H01L 29/786
[52] U.S. Cl. ............... 257/66; 257/344; 257/401; 438/166; 438/286; 438/595
[58] Field of Search ...................... 438/230, 231, 438/163, 151, 595, 585, 286; 257/288, 290, 327, 335, 336, 347, 344, 401, 408, 503, 773, 775, 66

[56] References Cited

U.S. PATENT DOCUMENTS

| | | | |
|---|---|---|---|
| 5,151,374 | 9/1992 | Wu ............................................ | 438/163 |
| 5,741,718 | 4/1998 | Codama et al. ........................ | 438/286 |
| 5,741,736 | 4/1998 | Orlowski et al. ...................... | 438/286 |
| 5,804,837 | 9/1998 | Han et al. ................................ | 257/66 |

OTHER PUBLICATIONS

Tanaka et al., "Characteristics of Offset–Structure Polycrystalline–Silicon Thin–Film Transistors", IEEE Electron Device Letters, vol. 9, No. 1, Jan. 1988, pp. 23–25

Primary Examiner—Mary Wilczewski
Attorney, Agent, or Firm—Morgan, Lewis & Bockius LLP

[57] ABSTRACT

A thin film transistor and a fabrication method thereof which are capable of increasing an ON/OFF current ratio and simplifying a fabrication process by eliminating a masking process. The thin film transistor includes a substrate, an active layer formed on the substrate, a gate electrode formed on the active layer and the substrate and having an opening portion inwardly extended from one edge surface thereof, an offset region formed in the active layer matching with the opening portion, and impurity regions formed within the active layer at both sides of the gate electrode.

19 Claims, 5 Drawing Sheets

THIN FILM TRANSISTOR AND FABRICATION METHOD THEREOF

BACKGROUND OF THE INVENTION

1. Field of the Invention

The present invention relates to a thin film transistor and a fabrication method thereof, and in particular to an improved thin film transistor and a fabrication method thereof which are capable of significantly increasing an ON/OFF current ratio.

2. Description of the Conventional Art

FIG. 1 illustrates a conventional top type polycrystalline-silicon thin film transistor.

As shown therein, on a substrate 11, a first oxide film 12 is formed. A polysilicon layer 13 is formed on the first oxide film 12 by a chemical vapor deposition (CVD) method. A second oxide film 14 which is an insulation layer is formed on the polysilicon layer 13. Thereafter, using a mask (not shown), the second oxide film 14 is selectively etched so that the surface of the polysilicon layer 13 is exposed for forming source/drain portions thereon, and then a gate electrode 15 is formed on the second oxide film 14. Impurities such as B ions or P ions are implanted into the surface-exposed polysilicon layer 13 for thus forming the source/drain regions 16 and 17. Thereafter, the source/drain electrodes 18 and 19 which electrically contact with the source/drain regions 16 and 17 are formed, thus finally fabricating the conventional thin film transistor.

In the thin film transistor as shown in FIG. 1, when a higher voltage than the threshold voltage is supplied to the gate electrode 15, and when the voltage of the drain electrode 17 is increased to a voltage higher than the source electrode 16, electrons are transferred from the source 16 to the drain 17 through the channel region, thus generating a driving current. However, in the thin film transistor as shown in FIG. 1, when a channel is formed by applying voltage to the gate, the carrier mobility is degraded by an electric potential barrier formed at grain boundaries inside the polysilicon. Therefore, when the voltage is supplied thereto, the driving current is decreased by the electric potential barrier, so that a leakage current which decreases the ON/OFF current ratio of the drain current is generated due to the above-described problem.

A thin film transistor, which is capable of increasing the ON/OFF current ratio by forming an offset region and decreasing the leakage current, is disclosed in IEEE Electron Device Letters Vol. 9. No 1, January 1988 (Title: Characteristics of offset structure polycrystalline silicon . . . ).

Referring to FIG. 2, the fabrication method of the above-described thin film transistor will now be explained.

First, on a substrate 21, a polysilicon film 22 is deposited by an LPCVD (Low Pressure chemical Vapor Deposition) method. A low density of P-ions are implanted into offset regions 23a and 23b, and a high density of P-ions are implanted into the source/drain regions 24a and 24b. The resultant structure is heat-processed at a temperature of about 900° C. for activating the implanted impurities, and then a gate insulation film 25 formed of SiN is deposited on the polysilicon layer 22. A contact hole is formed in the gate insulation film 25, and an aluminum layer is deposited on the resultant structure. Thereafter, the aluminum layer is etched for thus forming a gate electrode 26, a source electrode 27, and a drain electrode 28. At this time, the offset length Ls is 3 μm through 7 μm.

In the thin film transistor as shown in FIG. 2, the ON/OFF current ratio is increased up to a level higher than that of the thin film transistor as shown in FIG. 1 by the offset regions 23a and 23b. However, the current is disadvantageously decreased in the turn-on mode due to the offset region 23a formed near the source region 24a. In order to overcome the above-described problem, a transistor in which the offset region 23a was not formed near the source region 24a was proposed in the industry. Moreover, the above-described thin film transistor fabrication method has a disadvantage in that an additional masking process step is needed for defining the source/drain regions and the offset region, thus complicating the fabrication process.

SUMMARY OF THE INVENTION

Accordingly, it is an object of the present invention to provide a thin film transistor and a fabrication method thereof which overcome the aforementioned problem encountered in the conventional art.

It is another object of the present invention to provide an improved thin film transistor and a fabrication method thereof which are capable of increasing an ON/OFF current ratio and simplifying a fabrication process by eliminating a masking process.

To achieve the above objects, there is provided a thin film transistor which includes a substrate, an active layer formed on the substrate, a gate electrode formed on the active layer and the substrate and having an opening portion inwardly extended from one edge surface thereof, an offset region formed in the active layer corresponding with the opening portion in the gate electrode, and impurity regions formed within the active layer formed at both sides of the gate electrode.

To achieve the above objects, there is provided a thin film transistor fabrication method which includes the steps of forming an active layer on a substrate, forming a gate insulation film on the active layer and forming a gate electrode, having an opening portion which is extended from an edge thereof, on the gate insulation film, forming a sidewall at at least one of the gate electrode, and forming impurity regions within the active layer at both sides of the gate electrode.

Additional advantages, objects and features of the invention will become more apparent from the description which follows.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1:
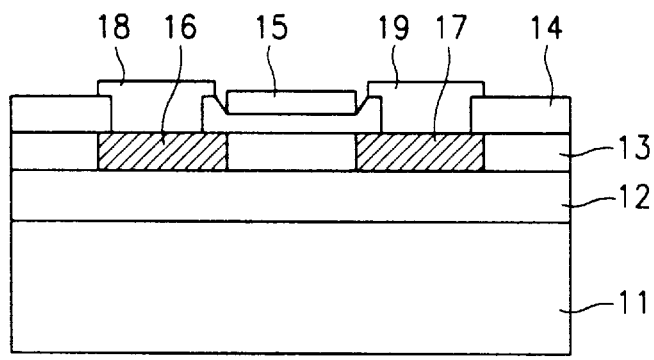
FIG. 1 is a cross-sectional view illustrating a conventional top type polycrystalline-silicon thin film transistor.
Figure 2:
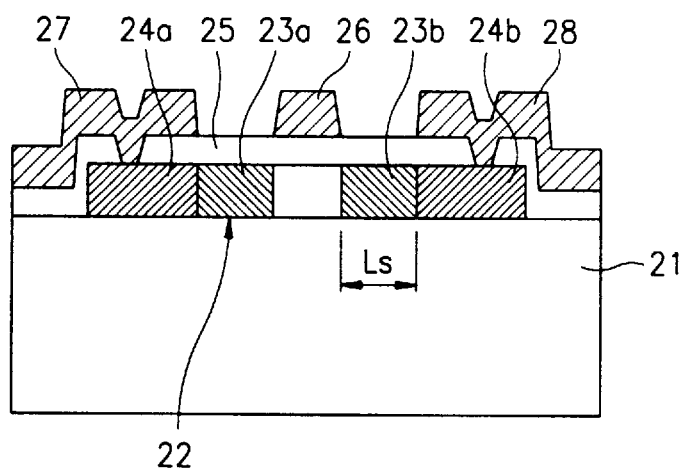
FIG. 2 is a cross-sectional view illustrating a conventional thin film transistor having an offset region.
Figure 3:
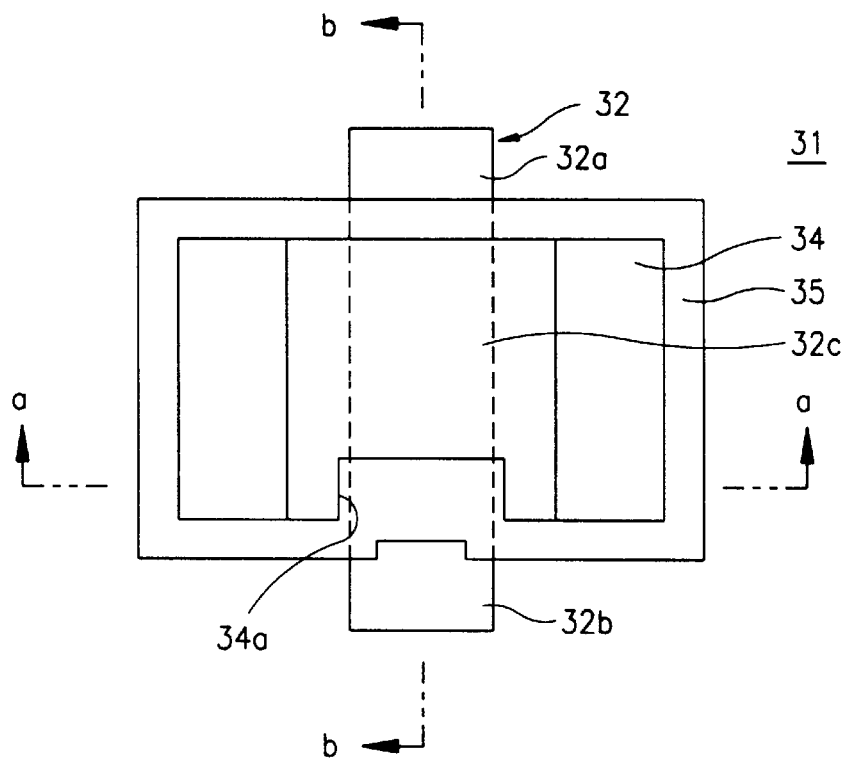
FIG. 3 is a plan view illustrating a thin film transistor according to the present invention.
Figure 4:
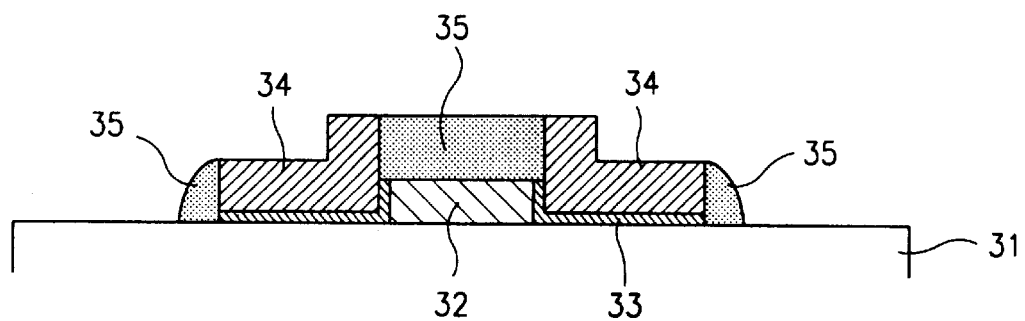
FIG. 4 is a cross-sectional view taken along line "a—a" of FIG. 3.
Figure 5:
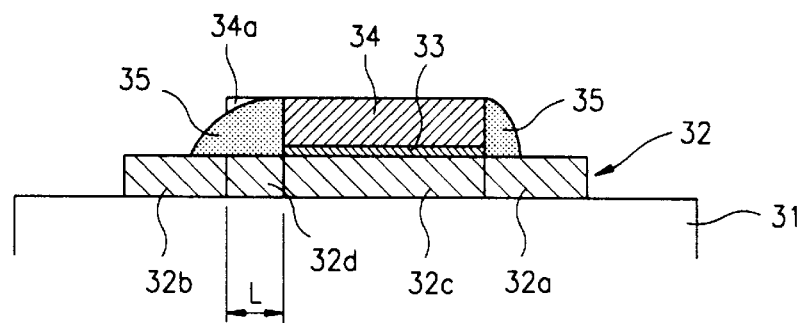
FIG. 5 is a cross-sectional view taken along line "b—b" of FIG. 3.

FIG. 3 illustrates a thin film transistor according to the present invention. FIG. 4 is a cross-sectional view taken along line "a—a" of FIG. 3, and FIG. 5 is a cross-sectional view taken along line "b—b" of FIG. 3.

As shown therein, the thin film transistor includes a substrate 31. An active layer 32 formed of a polysilicon is formed on the upper surface of the substrate 31. Doped regions 32a and 32b which become a source region and a drain region, respectively, are formed at respective sides in the active layer 32. A channel region 32c is formed between the source region 32a and the drain region 32b for thus separating the source region 32a and the drain region 32b. An offset region 32d is extended by a predetermined length L from the drain region 32b towards the source region 32a within the channel region 32c.

A gate insulation film 33 formed of an oxide is formed on the upper surfaces of the channel region 32c and the substrate 31, and a gate electrode 34 having an opening portion 34a is formed on the upper surface of the gate insulation film 33. The opening portion 34a is inwardly extended from a margin of the gate electrode 34 so that an upper portion of the offset region 32d is exposed. An insulation sidewall 35 is formed at a sidewall of the gate electrode 34. The insulation sidewall 35 is formed in such a manner that the opening portion 34a is fully filled for covering the upper portion of the offset region 32d. The insulation sidewall 35 is formed of an oxide or a nitride. The offset region 32d is defined by the insulation sidewall 35.

The fabrication method of the thin film transistor according to the present invention will now be explained with reference to the accompanying drawings.

Figure 6A:
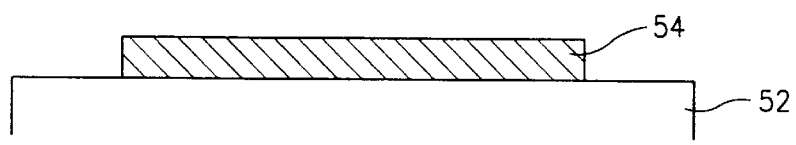
FIGS. 6A through 6E are cross-sectional views illustrating a thin film transistor fabrication method according to the present invention.

First, as shown in FIG. 6A, an active layer 54 of a polysilicon is formed on the substrate 52. The active layer 54 is formed on the substrate 52 by a CVD (Chemical Vapor Deposition) method for thus forming a polysilicon layer, and then the polysilicon layer is patterned.

Figure 6B:
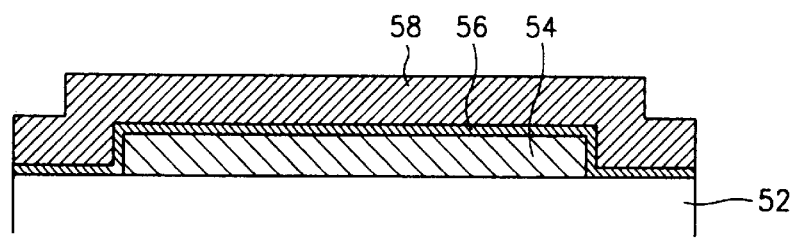

As shown in FIG. 6B, an oxide film 56 which is used as a gate insulation film is formed on the substrate 52 and the active layer 54, and a polysilicon layer 58 which becomes a gate electrode is formed on the oxide film 56. The oxide film 56 is formed by a CVD method or by thermally oxidizing the active layer 54 formed of a polysilicon. When the oxide film 56 is formed by a thermal oxidation, the oxide film 56 is formed on only the active layer 54. The impurities are ion-implanted into the polysilicon layer 58 to increase the conductivity of the polysilicon layer 58. Impurities such as B, As, P, etc. are used.

Figure 6C:
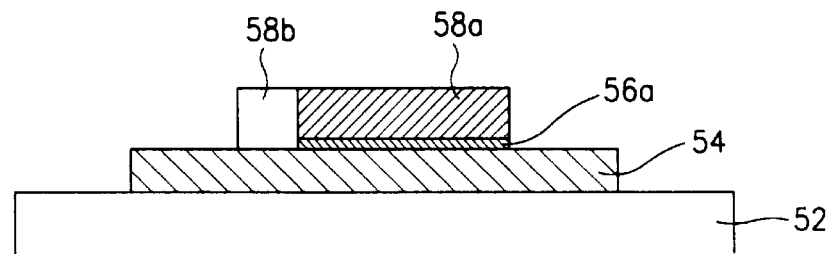
Figure 7:
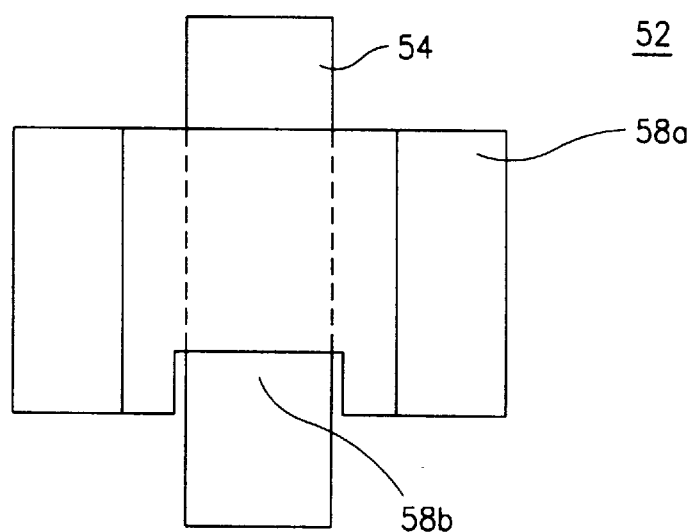
FIG. 7 is a plan view of a thin film transistor structure rotated 90° relative that shown in FIG. 6C.

As shown in FIG. 6C, the oxide film 56 and the polysilicon layer 58 are patterned, thus forming a gate insulation film 56a from the oxide film 56 and a gate electrode 58a from the polysilicon layer 58. The gate electrode 58a is formed in such a manner that both ends of the active layer 54 are exposed, and an opening portion 58b is inwardly extended from an edge portion of the gate electrode 58a. The opening portion 58b is formed on the active layer 54 so that one end of the active layer 54 is extended more than the other end of the same from the gate electrode 58a. The gate electrode 58a having the opening portion 58b is formed by a photolithography process using a gate mask. The pattern of the gate mask is formed identically to the shape of the gate electrode 58a having the opening portion 58b as shown in FIG. 7.

Figure 6D:
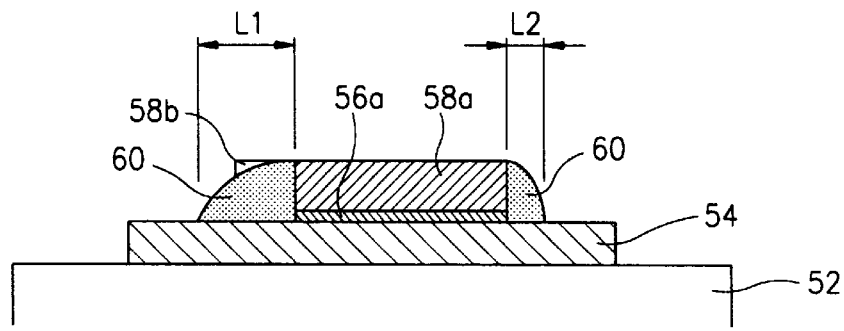
Figure 8:
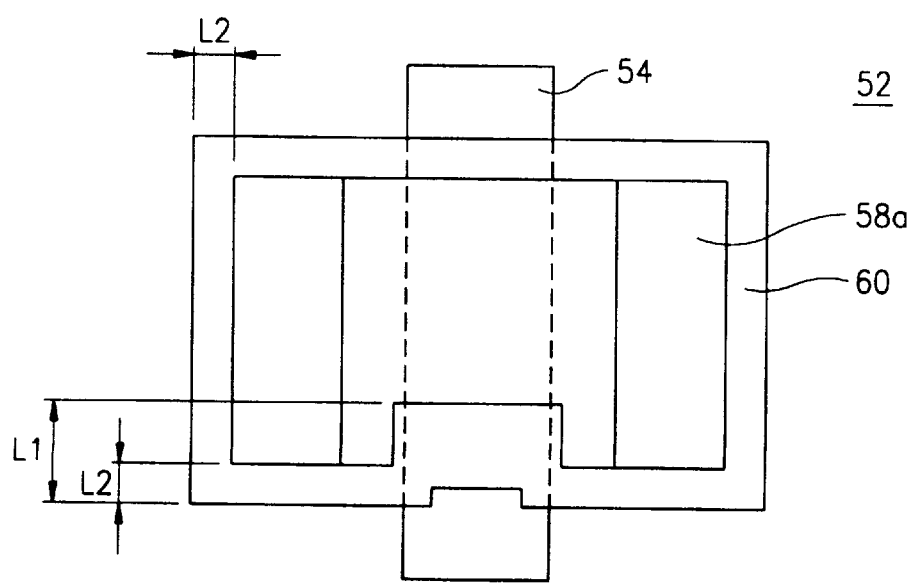
FIG. 8 is a plan view of a thin film transistor structure rotated 90° relative that shown in FIG. 6D.

As shown in FIGS. 6D and 8, an insulation film is formed on the entire structure as shown in FIG. 6C, and then the insulation film is anisotropically etched to leave the insulation film sidewall 60 formed at the sides of the gate electrode 58a. The sidewalls 60 are formed such that the opening portion 58b is fully filled thereby. The length L1 of the sidewall 60 filled in the opening portion 58b is longer than that of the length L2 of the peripheral sidewall 60. The insulation film may be an oxide film or a nitride film.

Figure 6E:
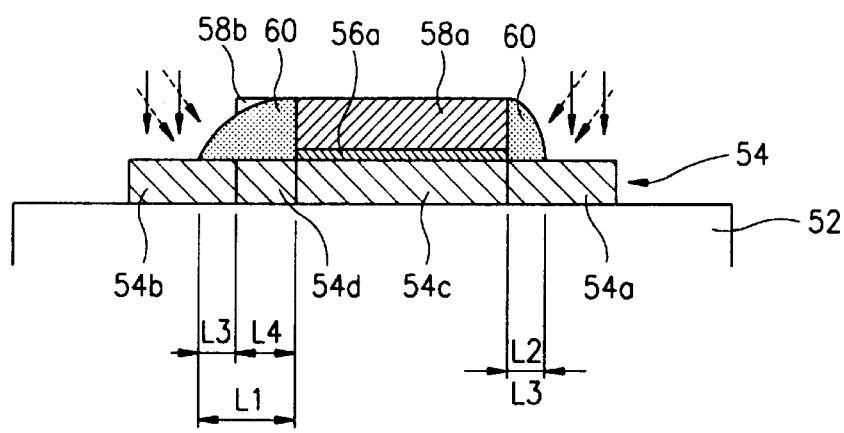

As shown in FIG. 6E, ions are implanted into the active layer 54 by using the gate electrode 58a and the insulation sidewall 60 as a mask, and then the resultant structure is heat-processed for thus forming the impurity regions 54a and 54b which become the source region 54a and the drain region 54b, respectively. The impurities which are used during the ion implantation are selected from the group comprising B, As, and P, or two or more selected from the group comprising B, As, and P may be mixed. The direction of the ion implantation is generally perpendicular with respect to the substrate 52. However, if the length L1 of the sidewall 58a filled into the opening portion 58b is longer than the length L4 of the offset region 54d, ions are driven-into the portion corresponding to the length L3 which is obtained by subtracting the length L4 from the length L1, by a slant ion implantation method which is capable of reducing the length of the off-set region 54d compared to the perpendicular (vertical) type ion implantation method. In addition, the implantation length L3 of the impurities during the slant ion implantation or heat processing satisfies the condition "L2≦L3<L1". Therefore, on the assumption that the length which is obtained by subtracting the implantation length L3 from the length L1 of the sidewall 58a filled into the opening portion 58b is L4, the offset region 54d formed between the drain region 54b and the channel region 54c is equal in length to L4.

As described above, in the thin film transistor and the fabrication method therefor according to the present invention, it is possible to increase the ON/OFF current ratio by reducing the OFF current due to the offset region formed in the drain portion. In addition, since an additional mask is not needed for forming the offset, the fabrication process is simplified.

Although the preferred embodiment of the present invention has been disclosed for illustrative purposes, those skilled in the art will appreciate that various modifications, additions and substitutions are possible, without departing from the scope and spirit of the invention as recited in the accompanying claims.

What is claimed is:
1. A thin film transistor, comprising:
    a substrate;
    an active layer formed on the substrate;
    a gate electrode formed on the active layer and the substrate and having an opening portion inwardly extended from one edge surface of the gate electrode only on a cross region of the active layer and the gate electrode;
    an offset region formed on the active layer corresponding to the opening portion in the gate electrode; and
    impurity regions formed within the active layer at both sides of the gate electrode.
2. The thin film transistor of claim 1, wherein the active layer is formed of a polysilicon.
3. The thin film transistor of claim 1, wherein a sidewall is formed at at least one side of the gate electrode.
4. The thin film transistor of claim 3, wherein the sidewall entirely covers the offset region.

5. The thin film transistor of claim 3, wherein the sidewall is formed of an insulation material.

6. The thin film transistor of claim 5, wherein the insulation material is selected from an oxide and a nitride.

7. The thin film transistor of claim 1, wherein the substrate is formed of an insulation material.

8. The thin film transistor of claim 1, wherein the substrate is formed by forming an insulation material on the substrate.

9. The thin film transistor of claim 1, wherein the gate electrode is formed of a doped polysilicon.

10. A thin film transistor comprising:

a substrate;

an active layer formed on the substrate;

a gate electrode formed on the active layer and the substrate and having an opening portion inwardly extended from one edge surface of the gate electrode;

an offset region formed on the active layer corresponding to the opening portion in the gate electrode; and impurity regions formed within the active layer at both sides of the gate electrode,
wherein a sidewall is formed at at least one side of the gate electrode,
wherein the sidewall entirely covers the offset region, and
wherein the length of the sidewall covering the offset region is longer than a length of one of the sidewalls which does not cover the offset region.

11. A thin film transistor comprising:

a substrate;

an active layer formed on the substrate;

a U-shaped gate electrode formed on the active layer and the substrate and having an opening portion inwardly extended from one edge surface of the gate electrode only on a cross region of the active layer and the gate electrode;

an offset region formed on the active layer corresponding to the opening portion in the gate electrode; and impurity regions formed within the active layer at both sides of the gate electrode.

12. The thin film transistor of claim 11, wherein the active layer is formed of a polysilicon.

13. The thin film transistor of claim 11, wherein the substrate is formed of an insulation material.

14. The thin film transistor of claim 11, wherein the substrate is formed by forming an insulation material on the substrate.

15. The thin film transistor of claim 11, wherein the gate electrode is formed of a doped polysilicon.

16. A thin film transistor comprising:

a substrate:

an active layer formed on the substrate;

a U-shaped gate electrode formed on the active layer and the substrate and having an opening portion inwardly extended from one edge surface of the gate electrode;

an offset region formed on the active layer corresponding to the opening portion in the gate electrode; and impurity regions formed within the active layer at both sides of the gate electrode, wherein a sidewall is formed at at least one side of the gate electrode.

17. The thin film transistor of claim 16, wherein the sidewall is formed of an insulation material.

18. The thin film transistor of claim 17, wherein the insulation material is selected from an oxide and a nitride.

19. A thin film transistor comprising:

a substrate;

an active layer formed on the substrate;

a U-shaped gate electrode formed on the active layer and the substrate and having an opening portion inwardly extended from one edge surface of the gate electrode;

an offset region formed on the active layer corresponding to the opening portion in the gate electrode; and impurity regions formed within the active layer at both sides of the gate electrode, wherein the sidewall entirely covers the offset region.

* * * * *